(12) United States Patent
Kim et al.

(10) Patent No.: US 8,324,786 B2
(45) Date of Patent: Dec. 4, 2012

(54) PIEZOELECTRIC ACTUATOR MODULE

(75) Inventors: Jae Kyung Kim, Gyunggi-do (KR); Yeon Ho Son, Gyunggi-do (KR); Ki Suk Woo, Seoul (KR); Su Young Jung, Gyunggi-do (KR); Ji Yeoun Jang, Gyunggi-do (KR); Dong Sun Park, Seoul (KR); Kum Kyung Lee, Gyunggi-do (KR); Dae Woong Yun, Incheon (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 138 days.

(21) Appl. No.: 12/787,333

(22) Filed: May 25, 2010

(65) Prior Publication Data

US 2011/0163635 A1    Jul. 7, 2011

(30) Foreign Application Priority Data

Jan. 4, 2010   (KR) .................. 10-2010-0000200

(51) Int. Cl.
*H01L 41/09*   (2006.01)

(52) U.S. Cl. ....................................... 310/328
(58) Field of Classification Search .................. 310/328
See application file for complete search history.

(56) References Cited

U.S. PATENT DOCUMENTS

| 4,453,103 | A | * | 6/1984 | Vishnevsky et al. | 310/323.02 |
|---|---|---|---|---|---|
| 5,039,899 | A | * | 8/1991 | Yamaguchi | 310/323.16 |
| 5,416,375 | A | * | 5/1995 | Funakubo et al. | 310/323.16 |
| 6,051,912 | A | * | 4/2000 | Gonda | 310/323.02 |
| 6,104,123 | A | * | 8/2000 | Okazaki et al. | 310/323.09 |
| 6,242,846 | B1 | * | 6/2001 | Ashizawa et al. | 310/323.02 |
| 2004/0206596 | A1 | * | 10/2004 | Ohashi et al. | 192/84.9 |

FOREIGN PATENT DOCUMENTS

| JP | 07-177767 | * | 7/1995 |
|---|---|---|---|
| JP | 09-327185 A | * | 12/1997 |

* cited by examiner

*Primary Examiner* — Thomas Dougherty
(74) *Attorney, Agent, or Firm* — Blakely Sokoloff Taylor & Zafman LLP

(57) ABSTRACT

Disclosed herein is a piezoelectric actuator module. The piezoelectric actuator module includes a flat plate. An elastic member is provided on each of opposite ends of the plate in a longitudinal direction thereof, and protrudes perpendicularly from the plate in such a way that a first end of the elastic member is coupled to an electronic device. A plate-shaped elastic body is provided on a first surface of the plate. A piezoelectric element is provided on a first surface of the elastic body. The plate-shaped elastic body is provided between the plate and the piezoelectric element, so that the overall spring constant of the piezoelectric actuator module is lowered and thus the vibrating force of the piezoelectric actuator module is increased.

10 Claims, 7 Drawing Sheets

PIEZOELECTRIC ACTUATOR MODULE

CROSS REFERENCE TO RELATED APPLICATION

This application claims the benefit of Korean Patent Application No. 10-2010-0000200, filed on Jan. 4, 2010, entitled "Piezoelectric Actuator Module", which is hereby incorporated by reference in its entirety into this application.

BACKGROUND OF THE INVENTION

1. Technical Field

The present invention relates to a piezoelectric actuator module.

2. Description of the Related Art

Several methods have been used to permit easier and more convenient communication between a user and a computer or a program. Recently, a haptic device including the concept of reflecting a user's intuitive experience with an interface and diversifying feedback, in addition to including the concept of inputting by touching the device, has been widely used.

The haptic device has many advantages in that space is saved, manipulability is improved and convenience is achieved, it is easy to change the specification thereof, valuation by consumers is high, and it is easy to be operated in conjunction with IT equipment. Owing to these advantages, the haptic device has been widely used in a variety of fields including the fields of industry, traffic, service, medical service and mobile-equipment.

In the general haptic device, a transparent touch panel is placed to be in close contact with an image display device, such as an LCD which displays an image. When a user presses and manipulates the touch panel while viewing the image through the touch panel, a vibration generating means such as a vibration motor or a piezoelectric actuator applies the sensation of vibration to the touch panel, thus transmitting the sensation of vibration to the user.

However, among the vibration generating means, the vibration motor is problematic in that it vibrates an entire portion of a mobile phone to apply touch feedback to a user, so that vibration transmitted through the touch panel to the user is reduced. Thus, recently, research on a piezoelectric actuator which vibrates a specific part to improve a sensation of vibration transmitted to a user has been actively conducted. However, it is difficult to commercialize a piezoelectric actuator module which is capable of reducing volume and increasing vibrating force.

SUMMARY OF THE INVENTION

The present invention has been made in an effort to provide a piezoelectric actuator module, which has a structure optimal for increasing vibrating force.

In a piezoelectric actuator module according to an embodiment of the present invention, a flat plate is provided. An elastic member is provided on each of opposite ends of the plate in a longitudinal direction thereof, and protrudes perpendicularly from the plate in such a way that a first end of the elastic member is coupled to an electronic device. A plate-shaped elastic body is provided on a first surface of the plate. A piezoelectric element is provided on a first surface of the elastic body.

The elastic member may be a coil spring.

Further, the elastic member may be integrated with the plate.

The elastic member may protrude perpendicularly from a second surface of the plate.

The elastic member may protrude perpendicularly from the first surface of the plate.

A concave part may be formed in the first surface of the elastic body in a thickness direction thereof to correspond to the piezoelectric element, so that the piezoelectric element is inserted into and secured to the concave part.

Further, a thickness of the concave part may be thicker than a thickness of the piezoelectric element.

Further, the elastic member may include a disc protruding perpendicularly from the plate and coupled to the electronic device, and an elastic support extending from the disc to the plate in a swirling curve.

Three elastic supports may be provided and extended from positions trisecting the disc.

Four elastic supports may be provided and extended from positions dividing the disc into four equal parts.

Further, the elastic body may be made of rubber, liquid damper or magnetic fluid.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

DESCRIPTION OF THE PREFERRED EMBODIMENTS

Figure 1:
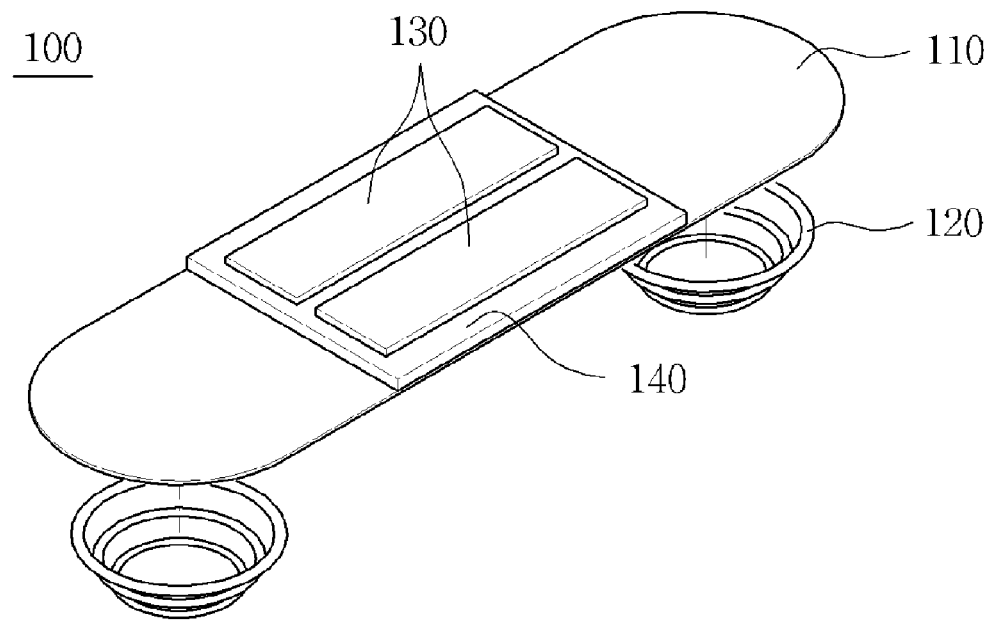
FIGS. 1 and 2 are exploded perspective views illustrating a piezoelectric actuator module according to a first embodiment of the present invention.

The above and other objects, features and advantages of the present invention will be more clearly understood from the following detailed description taken in conjunction with the accompanying drawings. Herein, the same reference numerals are used throughout the different drawings to designate the same components. Terms including "first surface" and "second surface" may be used to distinguish one component from another component, but the components should not be limited by the terms. Further, when it is determined that the detailed description of the known art related to the present invention may obscure the gist of the present invention, the detailed description will be omitted.

Hereinafter, the preferred embodiments of the present invention will be described in detail with reference to the accompanying drawings.

Figure 2:
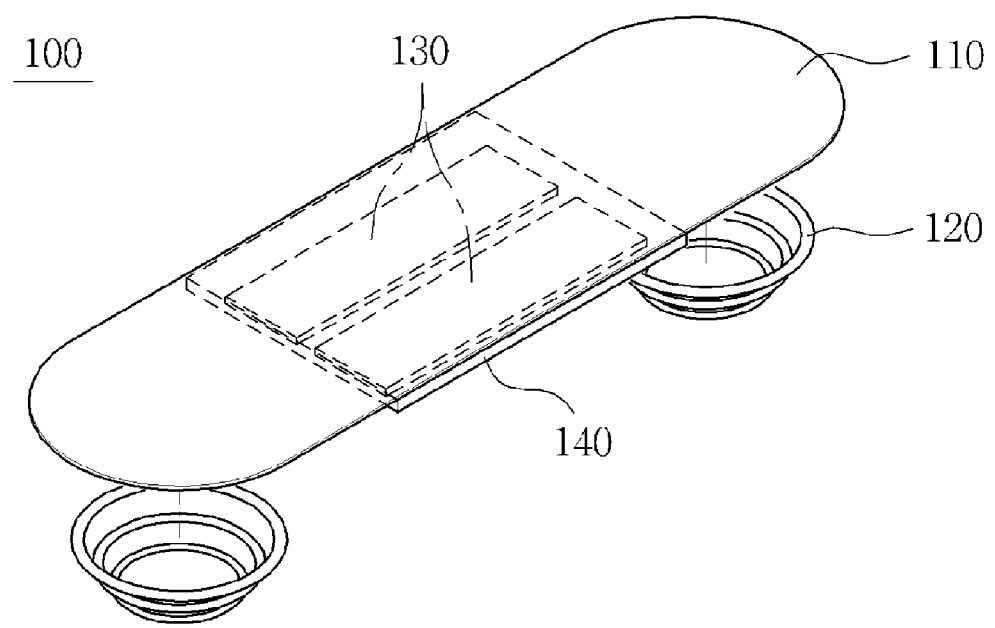
Figure 3:
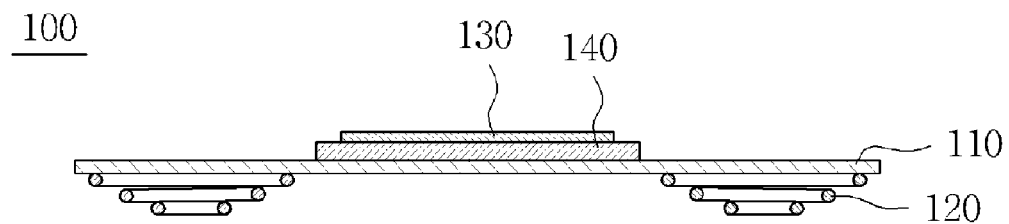
FIGS. 3 and 4 are side views illustrating the piezoelectric actuator module according to the first embodiment of the present invention.
Figure 4:
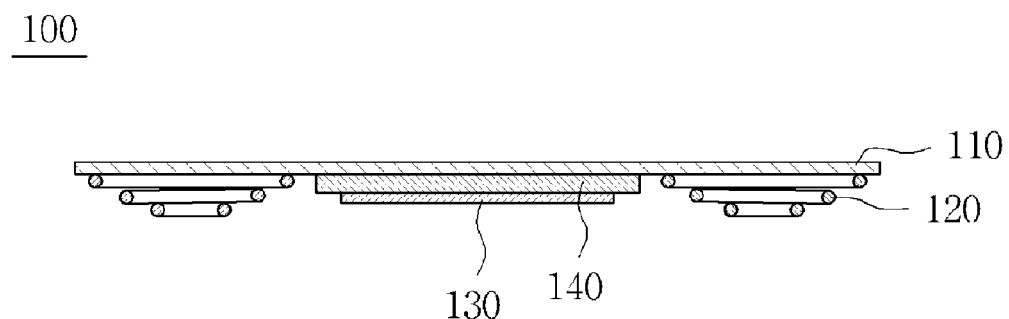

FIGS. 1 and 2 are exploded perspective views illustrating a piezoelectric actuator module according to a first embodiment of the present invention, and FIGS. 3 and 4 are side views illustrating the piezoelectric actuator module according to the first embodiment of the present invention.

As shown in FIGS. 1 to 4, the piezoelectric actuator module 100 according to this embodiment includes a flat plate 110, elastic members 120, an elastic body 140 and piezoelectric elements 130. The elastic members 120 are provided on the opposite ends of the plate 110 in a longitudinal direction thereof, and protrude perpendicularly from the plate 110 in such a way that a first end of each elastic member 120 is coupled to an electronic device. The elastic body 140 having the shape of a plate is provided on a first surface of the plate 110. The piezoelectric elements 130 are provided on a first surface of the elastic body 140.

The plate 110 supports the piezoelectric elements 130 to prevent shock from acting on the piezoelectric elements 130 during the driving of the piezoelectric actuator, in addition to increasing vibrating force of the piezoelectric elements 130. The material of the plate 110 is not limited to a special material. However, in order to stably support the piezoelectric elements 130 and effectively transmit vibrating force from the piezoelectric elements 130 to the electronic device, the plate 110 is preferably made of a material having a predetermined rigidity.

Further, vibrating force G satisfies equation, $G=-(m\times X\times w^2)/M$ (m=mass of part having displacement, X=displacement of piezoelectric element, w=driving frequency, M=whole mass). Referring to the equation, since the plate 110 is vibrated along with the piezoelectric elements 130, the value of m (mass of part having displacement) includes the mass of the plate 110, so that the value of m increases. Thus, even if the size of each piezoelectric element 130 is reduced, the vibrating force can be maintained, so that the manufacturing cost of the expensive piezoelectric element 130 can be reduced.

The elastic members 120 secure the plate 110 having the piezoelectric elements 130 to the electronic device, in addition to controlling the elasticity of the piezoelectric actuator module 100. According to this embodiment, each elastic member 120 comprises a general coil spring. Further, the elastic members 120 protrude perpendicularly from the plate 110. Two elastic members 120 are provided, respectively, on the opposite ends of the plate 110 in the longitudinal direction thereof. Here, in order to prevent the piezoelectric actuator module 100 from tilting and provide a more stable structure, the elastic members 120 are preferably provided on the opposite ends of the plate 110 to be symmetric with respect to the central axis of the plate 110 which is perpendicular to the longitudinal direction of the plate 110.

Meanwhile, the elastic members 120 may be formed on a second surface of the plate 110 which is opposite to the first surface of the plate 110 having the piezoelectric elements 130 (see FIGS. 1 and 3). If necessary, the elastic members 120 may be formed on a surface of the plate 110 having the piezoelectric elements 130 (see FIGS. 2 and 4).

The elastic body 140 has the shape of a plate and functions to lower the overall spring constant of the piezoelectric actuator module 100, thus increasing the vibrating force of the piezoelectric actuator module 100, and is provided on the first surface of the plate 110. Further, in place of directly attaching the piezoelectric elements 130 to the first surface of the plate 110, after the elastic body 140 is attached to the first surface of the plate 110, the piezoelectric elements 130 may be attached to the first surface of the elastic body 140. This results in an improvement in the assemblability of the elastic body 140. Therefore, since the elastic body 140 can be precisely mounted on the central axis in the longitudinal direction of the plate 110, the tilting of the piezoelectric actuator module 100 is prevented.

Meanwhile, the elastic body 140 may be made of rubber, a liquid damper, or magnetic fluid without being limited to a special material.

The piezoelectric elements 130 serve to generate vibrating force, and are provided on the first surface of the plate 110. Thus, when the piezoelectric elements 130 generate vibrating force, the plate 110 is vibrated along with the piezoelectric elements 130. The vibrating force is transmitted through the elastic members 120 coupled to the plate 110 to the electronic device. Hereinafter, the piezoelectric elements 130 will be described in detail. When power is applied to the piezoelectric elements 130, the piezoelectric elements 130 are extended or bent to generate vibrating force, and comprises a piezoelectric sheet (ceramic piezoelectric sheet) on which an electrode pattern is formed or laminated piezoelectric sheets. By appropriately determining the electrode pattern printed on the surface of the piezoelectric sheet, the piezoelectric element 130 generate a first vibration mode and a second vibration mode, for example, a stretching vibration mode generated in the longitudinal direction of the piezoelectric element 130 and a bending vibration mode generated in the thickness direction of the piezoelectric element 130. Since various laminated structures and electrode pattern structures for the piezoelectric sheet of the piezoelectric elements 130 are widely known to those skilled in the art, a detailed description will be omitted herein.

Figure 5:
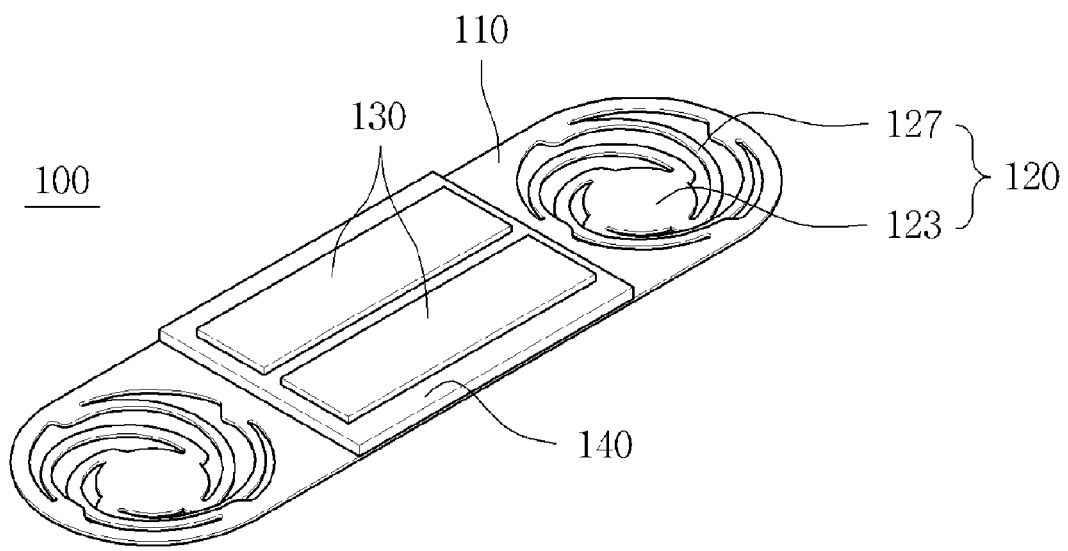
FIGS. 5 and 6 are perspective views illustrating a piezoelectric actuator module according to a second embodiment of the present invention.
Figure 6:
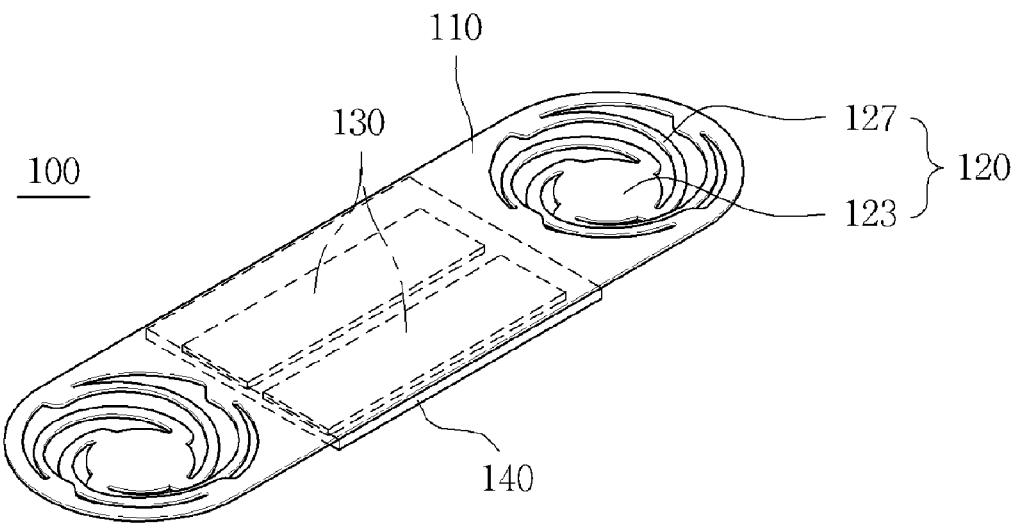
Figure 7:
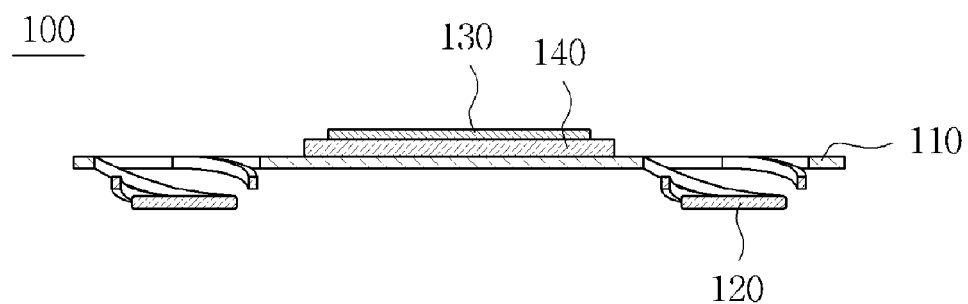
FIGS. 7 and 8 are side views illustrating the piezoelectric actuator module according to the second embodiment of the present invention.
Figure 8:
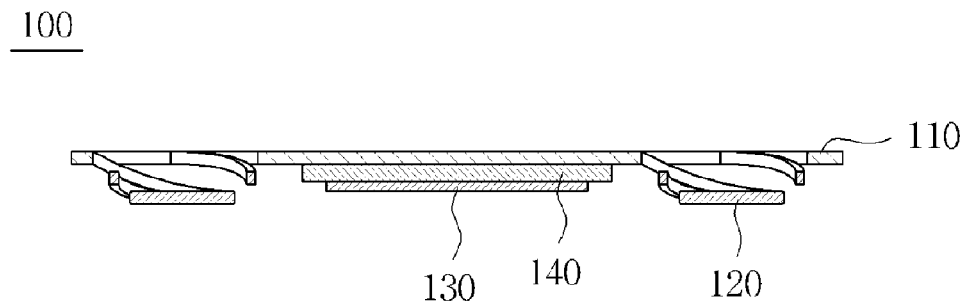
Figure 9:
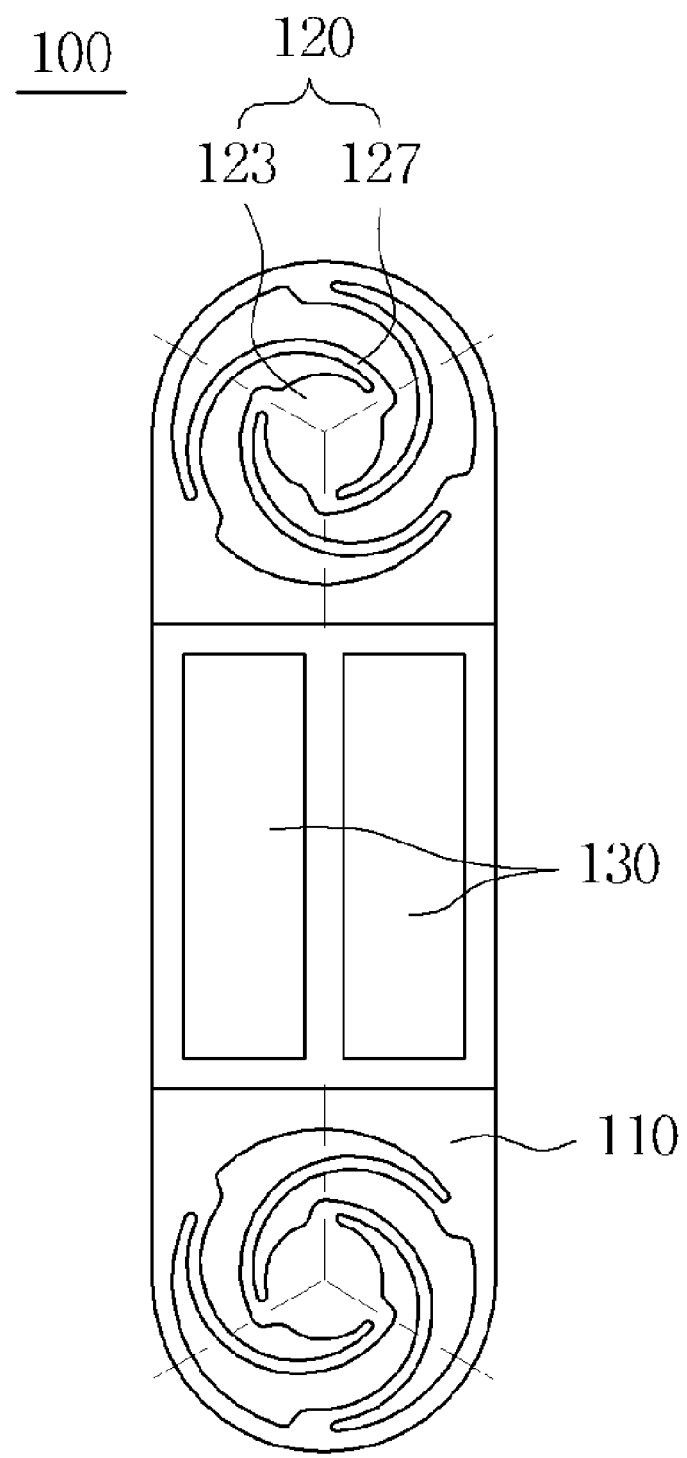
FIGS. 9 and 10 are plan views illustrating the piezoelectric actuator module according to the second embodiment of the present invention.
Figure 10:
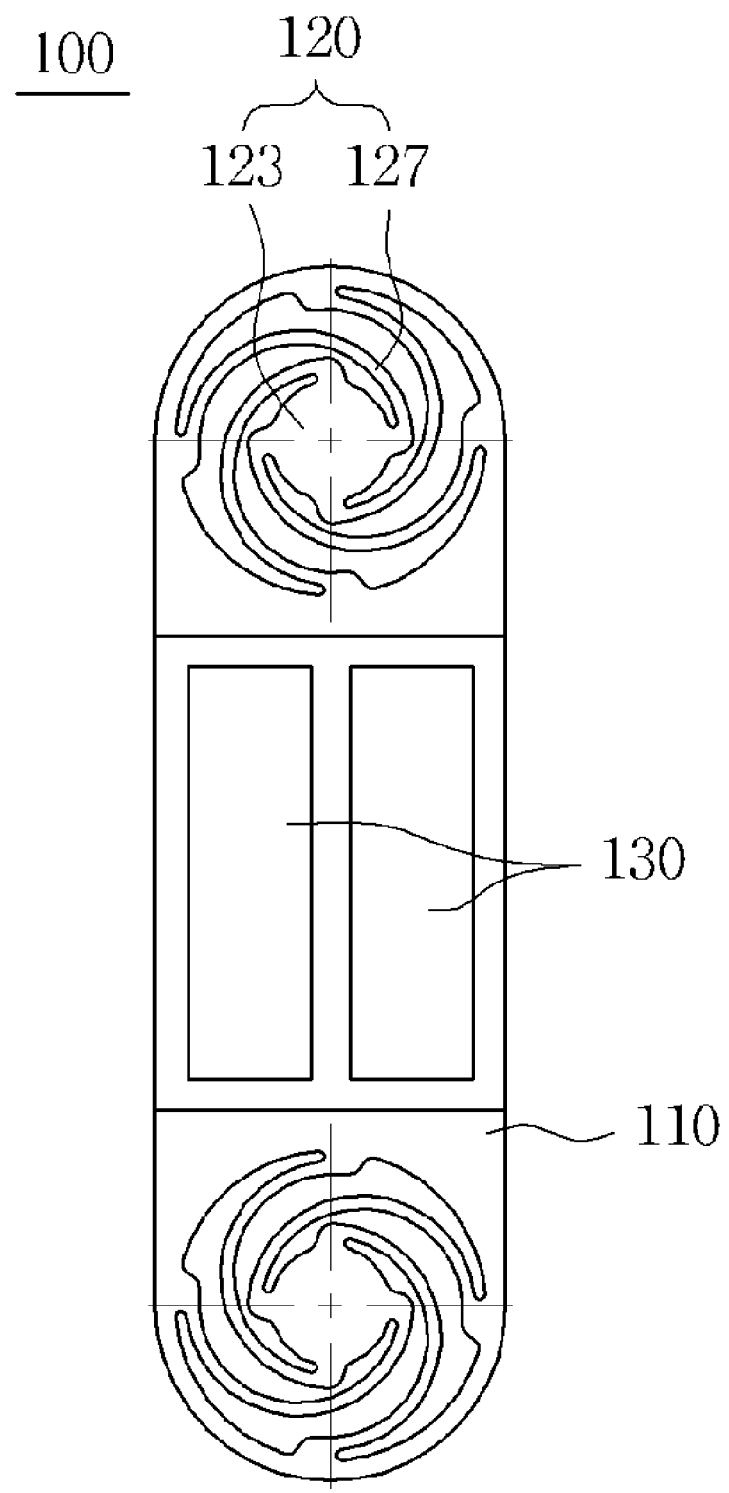

FIGS. 5 and 6 are perspective views illustrating a piezoelectric actuator module according to a second embodiment of the present invention, FIGS. 7 and 8 are side views illustrating the piezoelectric actuator module according to the second embodiment of the present invention, and FIGS. 9 and 10 are plan views illustrating the piezoelectric actuator module according to the second embodiment of the present invention.

As shown in FIGS. 5 to 10, the greatest difference between the first and second embodiments is the structure of an elastic member 120. Thus, a duplicate description of components common to both the first and second embodiments will be omitted, and the structure of the elastic member 120 will be mainly described.

When comparing the elastic member 120 of the second embodiment with the elastic member 120 of the first embodiment, the general coil spring is coupled to the plate 110 in the first embodiment, but the elastic member 120 is integrated with the plate 110 in the second embodiment. For example, the elastic members 120 may be integrated with the plate 110 by cutting and bending the opposite ends of the plate 110. Thus, the piezoelectric actuator module of the second embodiment is advantageous in that a process of manufacturing additional elastic members 120 and a process of attaching the elastic members 120 to the plate 110 may be omitted.

Further, the structure of each elastic member 120 will be described in detail. The elastic member 120 includes a disc 123 and an elastic support 127. The disc 123 protrudes perpendicularly from the plate 110 and is coupled to the electronic device. The elastic support 127 extends from the disc 123 to the plate 110 in a swirling curve, and substantially provides an elastic force. Thus, when the piezoelectric elements 130 are vibrated, a gap between the disc 123 and the plate 110 is changed by the elastic force of the elastic support 127, and vibrating force is transmitted to the electronic device. For example, three or four elastic supports 127 may be provided. In the case of having three elastic supports 127, the elastic supports 127 are extended from positions trisecting the disc 123 (see FIG. 9). Meanwhile, in the case of having four elastic supports 127, the elastic supports 127 are extended from positions dividing the disc 123 into four equal parts (see FIG. 10). This provides a stable structure.

Meanwhile, the elastic members 120 may be formed on a second surface of the plate 110 which is opposite to a first surface of the plate 110 having the piezoelectric elements 130 (see FIGS. 5 and 7), and may be formed on the surface of the plate 110 having the piezoelectric elements 130 (see FIGS. 6 and 8), as in the first embodiment.

Figure 11:
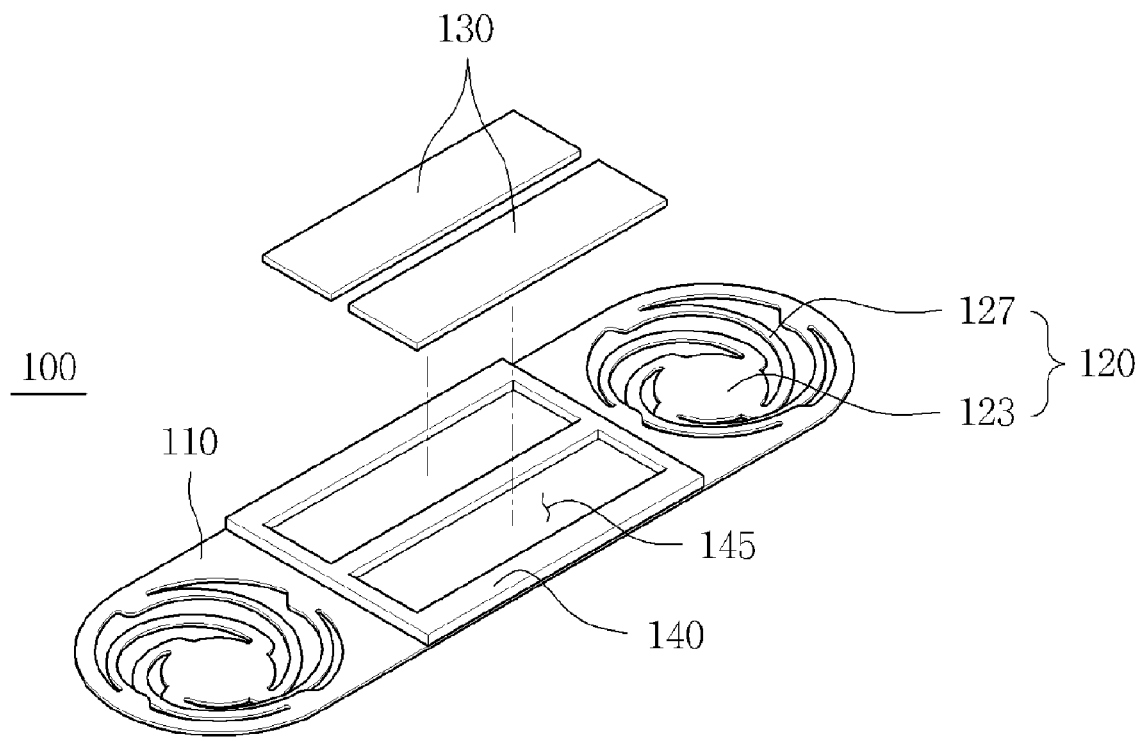
FIG. 11 is an exploded perspective view illustrating a piezoelectric actuator module according to a third embodiment of the present invention.
Figure 12:
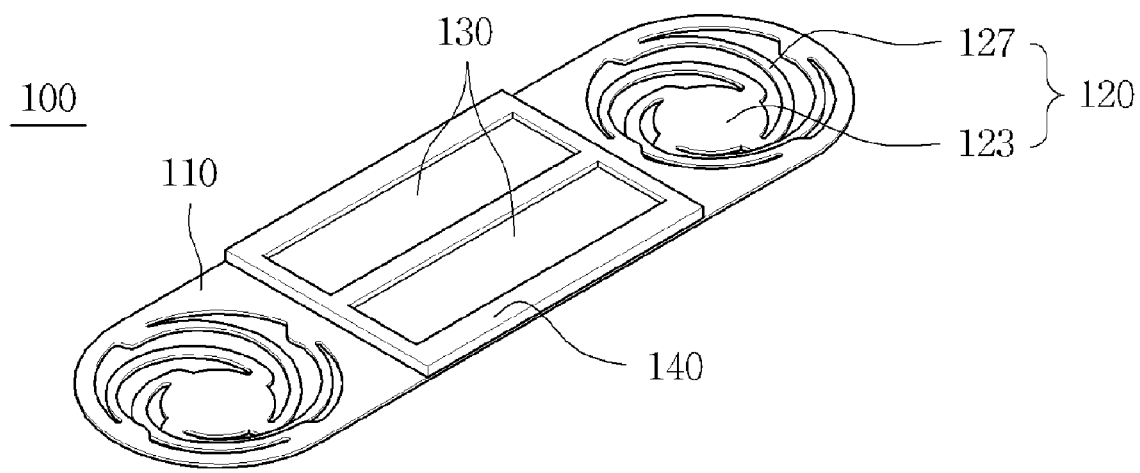
FIG. 12 is a perspective view illustrating the piezoelectric actuator module according to the third embodiment of the present invention.
Figure 13:
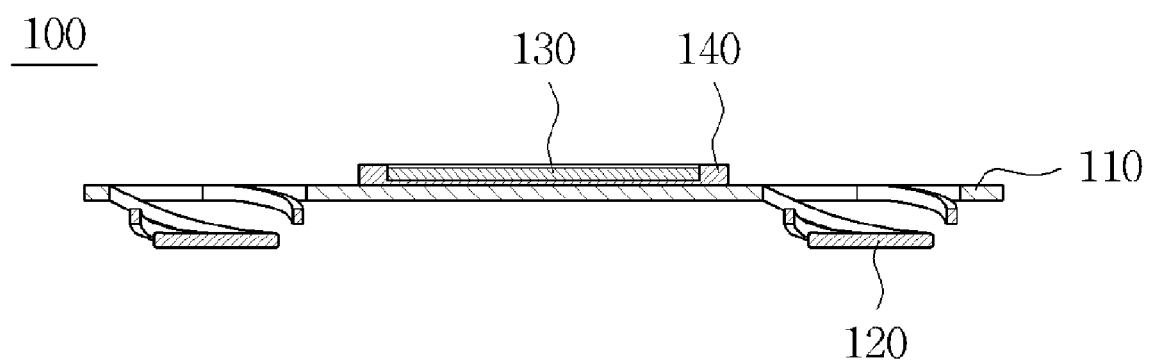
FIG. 13 is a side view illustrating the piezoelectric actuator module according to the third embodiment of the present invention.

FIG. 11 is an exploded perspective view illustrating a piezoelectric actuator module according to a third embodiment of the present invention, FIG. 12 is a perspective view illustrating the piezoelectric actuator module according to the third embodiment of the present invention, and FIG. 13 is a side view illustrating the piezoelectric actuator module according to the third embodiment of the present invention.

As shown in FIGS. 11 to 13, the greatest difference between the first to third embodiments is a coupling structure of the piezoelectric elements 130 with an elastic body 140. Thus, a duplicate description of components common to the embodiments will be omitted, and the coupling structure of the piezoelectric elements 130 with the elastic body 140 will be mainly described.

According to this embodiment, concave parts 145 are formed in a surface of the elastic body 140 in the thickness direction thereof so that the piezoelectric elements 130 are inserted into and secured to the concave parts 145. Here, the concave parts 145 are formed to have shape corresponding to the piezoelectric elements 130. Since the piezoelectric elements 130 are inserted into and secured to the concave parts 145 of the elastic body 140, a contact area of the elastic body 140 and the piezoelectric elements 130 is large, so that the strength of attaching the piezoelectric elements 130 is improved. Further, since the piezoelectric elements 130 are fixed to the concave parts 145, the fixing positions are not changed and a change in driving frequency caused by a change in attaching positions of the piezoelectric elements 130 is prevented.

Further, the concave parts 145 are formed to be thicker than the piezoelectric elements 130, so that the exposure surface of the elastic body 140 may be positioned to be higher than the exposure surface of each piezoelectric element 130. In this case, although the piezoelectric actuator module 100 comes into contact with a casing of the electronic device while vibrating, the piezoelectric elements 130 are not in direct contact with the casing of the electronic device, but the elastic body 140 comes into contact with the casing of the electronic device. Therefore, damage to the piezoelectric elements 130 and noise generated when the piezoelectric actuator module 100 contacts the casing of the electronic device can be prevented.

Meanwhile, as shown in the drawings, the elastic members 120 according to this embodiment are formed on a second surface of the plate 110 which is opposite to a first surface of the plate 110 having the piezoelectric elements 130. However, without being limited to such an arrangement, the elastic members 120 may be formed on the surface of the plate 110 having the piezoelectric elements 130, as in the above-mentioned embodiments. Further, the elastic members 120 according to the third embodiment shown in the drawings are equal to the elastic members 120 according to the second embodiment. However, each elastic member 120 may use a coil spring, as in the first embodiment.

As described above, the present invention provides a piezoelectric actuator module, in which a plate-shaped elastic body is provided between a plate and a piezoelectric element, so that the overall spring constant of the piezoelectric actuator module is lowered and thus the vibrating force of the piezoelectric actuator module is increased.

Further, the present invention provides a piezoelectric actuator module, in which a piezoelectric element is inserted into and secured to an elastic body, thus preventing damage to the piezoelectric element and preventing noise caused by contact of the piezoelectric element with an electronic device.

Furthermore, the present invention provides a piezoelectric actuator module, in which an elastic member is integrated with a plate, so that the manufacture of an additional elastic member can be omitted, thus saving manufacturing cost, and a process of assembling the elastic member with the plate can be omitted, thus simplifying the process of manufacturing the piezoelectric actuator module.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:
1. A piezoelectric actuator module, comprising:
a flat plate;
an elastic member provided on each of opposite ends of the plate in a longitudinal direction thereof, and protruding perpendicularly from the plate in such a way that a first end of the elastic member is coupled to an electronic device, wherein the elastic member comprises a disc protruding perpendicularly from the plate and an elastic support extending from the disc to the plate in a swirling curve;
a plate-shaped elastic body provided on a first surface of the plate; and
a piezoelectric element provided on a first surface of the elastic body.
2. The piezoelectric actuator module as set forth in claim 1, wherein the elastic member is a coil spring.
3. The piezoelectric actuator module as set forth in claim 1, wherein the elastic member is integrated with the plate.
4. The piezoelectric actuator module as set forth in claim 1, wherein the elastic member protrudes perpendicularly from a second surface of the plate.
5. The piezoelectric actuator module as set forth in claim 1, wherein the elastic member protrudes perpendicularly from the first surface of the plate.
6. The piezoelectric actuator module as set forth in claim 1, wherein a concave part is formed in the first surface of the elastic body in a thickness direction thereof to correspond to the piezoelectric element, so that the piezoelectric element is inserted into and secured to the concave part.

7. The piezoelectric actuator module as set forth in claim 6, wherein a thickness of the concave part is thicker than a thickness of the piezoelectric element.

8. The piezoelectric actuator module as set forth in claim 1, wherein three elastic supports are provided and extended from positions trisecting the disc.

9. The piezoelectric actuator module as set forth in claim 1, wherein four elastic supports are provided and extended from positions dividing the disc into four equal parts.

10. The piezoelectric actuator module as set forth in claim 1, wherein the elastic body is made of rubber, liquid damper or magnetic fluid.

\* \* \* \* \*